(12) United States Patent
Hosokawa et al.

(10) Patent No.: US 8,314,776 B2
(45) Date of Patent: Nov. 20, 2012

(54) SUBSTRATE PROCESSING APPARATUS, DISPLAY METHOD, STORAGE MEDIUM, AND PROGRAM

(75) Inventors: Hiroyuki Hosokawa, Hokkaido (JP); Ryoji Sakai, Tokyo (JP); Masashi Okuyama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 682 days.

(21) Appl. No.: 12/305,494

(22) PCT Filed: May 15, 2007

(86) PCT No.: PCT/JP2007/000523
§ 371 (c)(1),
(2), (4) Date: Dec. 18, 2008

(87) PCT Pub. No.: WO2007/148426
PCT Pub. Date: Dec. 27, 2007

(65) Prior Publication Data
US 2009/0225048 A1    Sep. 10, 2009

(30) Foreign Application Priority Data
Jun. 21, 2006    (JP) .................. 2006-171779

(51) Int. Cl.
*G06F 3/041*    (2006.01)
(52) U.S. Cl. ........................................ 345/173
(58) Field of Classification Search .......... None
See application file for complete search history.

(56) References Cited

U.S. PATENT DOCUMENTS

| | | | | |
|---|---|---|---|---|
| 6,493,082 | B2 * | 12/2002 | Nara et al. | 356/394 |
| 6,570,592 | B1 * | 5/2003 | Sajdak et al. | 715/769 |
| 6,810,494 | B2 * | 10/2004 | Weinberg et al. | 714/46 |
| 6,839,650 | B2 * | 1/2005 | Martin et al. | 702/123 |
| 6,944,829 | B2 * | 9/2005 | Dando | 715/798 |
| 7,050,921 | B2 * | 5/2006 | Sutton | 702/120 |
| 7,239,737 | B2 * | 7/2007 | Luque et al. | 382/141 |

FOREIGN PATENT DOCUMENTS

| | | |
|---|---|---|
| JP | 2000-161932 A | 6/2000 |
| JP | 2001-022493 A | 1/2001 |
| JP | 2001-035893 A | 2/2001 |
| JP | 2001-274065 A | 10/2001 |
| JP | 2001-356857 A | 12/2001 |
| JP | 2003-077785 A | 3/2003 |

OTHER PUBLICATIONS

Chinese Office action for Appl. No. CN 2007800227085 dated Dec. 11, 2009.
Korean Office action for 10-2008-7025518 dated Sep. 29, 2010.
International Search Report for PCT/JP2007/000523 dated Sep. 13, 2007.
Semi E95-0200, "Specification for Human Interface for Semiconductor Manufacturing Equipment," Semiconductor Equipment and Materials International, Feb. 2000.

* cited by examiner

*Primary Examiner* — K. Wong
(74) *Attorney, Agent, or Firm* — Pearne & Gordon LLP

(57) ABSTRACT

[Problems] A highly convenient maintenance screen needs to be displayed on a display panel when performing a maintenance while considering a correlation between a plurality of processing chambers. [Means for Solving the Problems] Since task buttons are displayed on a second display region 312 by arranging them from the left in an order of a time sequence in which each task button has been clicked, a highly convenient maintenance screen can be displayed on a touch panel 300 when performing a maintenance.

11 Claims, 10 Drawing Sheets

(e)      SCREEN NOT DISPLAYED BUT
         REMAINING IN HISTORY (f)

SUBSTRATE PROCESSING APPARATUS, DISPLAY METHOD, STORAGE MEDIUM, AND PROGRAM

TECHNICAL FIELD

The present invention relates to a substrate processing apparatus for use in a semiconductor manufacturing process such as a film forming process (e.g., a plasma CVD process), an etching process (e.g., a plasma etching process); a display method of a display panel for controlling the substrate processing apparatus; a program for executing the display on a computer; and a storage medium storing the program therein.

BACKGROUND ART

With regard to a recent substrate processing apparatus such as a semiconductor manufacturing apparatus or the like, it has been a mainstream technology to dispose a plurality of processing chambers for performing a process on a substrate such as a semiconductor wafer around a transfer system for the substrate and to perform the process intensively. In this regard, if a system size increases, the scale of maintenance therefor also increases, and the maintenance needs to be carried out by considering a correlation between the plurality of processing chambers.

The maintenance is generally carried out by acquiring apparatus information (temperature, pressure, gas flow rate, and so forth) by using a touch panel employing a GUI (Graphical User Interface), and performing a setup of conditions and the like based on the acquired information. Further, the GUI is standardized to some degree by SEMI.

The present inventors acknowledged that the GUI standardized by E95 of SEMI is not sufficient for the maintenance of the increasingly complicated substrate processing apparatus. However, they could not find any document related thereto in the relevant art.

[Non-patent Document]: E95 standard of SEMI

DISCLOSURE OF THE INVENTION

Problems to Be Solved by the Invention

Accordingly, in the field of the substrate processing apparatus such as the semiconductor manufacturing apparatus, a task of improving the convenience of a GUI screen for the maintenance of the substrate processing apparatus is a novel task yet to be attempted in the prior art, and the present invention is conceived to resolve the novel task. To be more specific, there has been a problem that a display of a screen using the GUI standardized by the SEMI is disadvantageous in the aspect of convenience when performing the maintenance by considering the correlation between the plurality of processing chambers.

In view of the foregoing, the present invention provides a substrate processing apparatus capable of displaying a highly convenient maintenance screen on a display panel when performing a maintenance by considering a correlation between a plurality of processing chambers, and also relates to a display method of the display panel for controlling the substrate processing apparatus; a program for executing the display method on a computer; and a storage medium storing the program therein.

Means for Solving the Problems (1) In order to solve the problems, the present invention provides a substrate processing apparatus including at least one processing chamber, the apparatus including: a display panel; a display control unit for performing a control for displaying at least screens necessary for a maintenance of the substrate processing apparatus and preset selecting buttons on the display panel; and a selecting unit for clicking the selecting buttons displayed on the display panel, wherein the display control unit arranges and displays, on a second display region of the display panel, a selecting button for selecting a screen among at least screens necessary for the maintenance of the substrate processing apparatus in an order of a time sequence in which the selecting buttons have been clicked; and displays the screen selected by the selecting button on as first display region of the display panel.

In the present invention, for example, since the selecting buttons for selecting the screen for each processing chamber, necessary for the maintenance of each processing chamber, are arranged and displayed on the display panel in the order of the time sequence in which the selecting buttons have been clicked, a highly convenient maintenance screen can be displayed on the display panel when the maintenance is performed while considering the correlation between the plurality of processing chambers.

"Displaying the selecting buttons on the display panel in the order of the time sequence in which the selecting buttons have been clicked" implies displaying the selecting buttons on the first second display region in the order of: "a selecting button for selecting a maintenance screen of a third processing chamber"; "a selecting button for selecting a maintenance screen of a second processing chamber"; and "a selecting button for selecting a maintenance screen of a first processing chamber" if, for example, a maintenance of the first processing chamber was performed by displaying the maintenance screen of the first processing chamber on the first display region; and then, a maintenance of the second processing chamber was carried out by displaying the maintenance screen of the second processing chamber; and thereafter, a maintenance of the third processing chamber was performed by displaying the maintenance screen of the third processing chamber in sequence.

When performing the maintenance of the apparatus, it hardly occurs an occasion that a maintenance of various processing chambers and the like are randomly performed. Rather, it is a dominant case that the maintenance of each processing chamber and the like is performed while moving between the processing chambers by considering the correlation of each processing chamber and so forth. Accordingly, for example, by displaying on the display panel the selecting buttons for selecting the screen for each processing chamber, necessary for the maintenance of each processing chamber, in the order of the time sequence in which the selecting buttons have been clicked, an operator can change the screens by using the selecting buttons more intuitionally.

It may be desirable that the display control unit displays the second display region along one side of the first display region; displays each selecting button on the second display region in a fixed length; leaves, when an entire length of the selecting buttons exceeds a length of the second display region, the excess selecting button as a history; and displays the left selecting button again on the second display region when a display thereof becomes possible.

When performing the maintenance of the semiconductor manufacturing apparatus, there is generally a limit in the number of processing chambers for which the maintenance is performed by the operator. Accordingly, it is not a frequent case that the entire length of the plural selecting buttons exceeds the length of the second display region even if each selecting button has the fixed length. Thus, in the present invention, by displaying each selecting button in the fixed length, the manipulation can be performed more intuitionally. Further, in case that the entire length of the plural selecting buttons exceeds the length of the second display region, the remaining button is displayed on the second display region disposed along a screen selected immediately prior to the selection of the screen displayed on the first display region. Thus, the inconvenience of searching for plural buttons from a single screen can be ameliorated. That is, when a desired button is not present on an initial screen, the desired button may be found by displaying a next screen. Accordingly, in comparison with the case of searching for the desired button from the plural selecting buttons displayed on the single screen, it is possible to find the desired button more easily.

Further it may be desirable that the display control unit displays, on a third display region of the display panel, a command button for closing the screen displayed on the first display region; and closes the screen on the first display region and also closes a selecting button, corresponding to the screen, displayed on the second display region when the command button for closing the screen displayed on the first display region is clicked by the selection unit.

On the first display region, when the screen is closed, it may be regarded that this screen is hardly used for the maintenance. Accordingly, on the assumption that the selecting button corresponding to this screen is hardly used either, the selecting button corresponding to this screen is closed on the second display region, so that an increase of a non-used selecting button on the second display region can be prevented.

It may be desirable that the display control unit displays, on the first display region, a single screen selected by the selecting unit among the screens according to contents of a maintenance as a screen necessary for the maintenance of the processing chamber displayed on the first display region.

The "screens according to the contents of the maintenance" refer to, as for a single processing chamber, a screen mainly showing a driving system in the processing chamber, a screen mainly showing a temperature, a screen mainly showing a pressure, a screen mainly showing a gas, and so forth. As described, by displaying the screens according to the contents of the maintenance for the single processing chamber, the maintenance can be more easily carried out.

It may be desirable that the display control unit is capable of displaying, on the first display region, each processing chamber screen for displaying a status of each processing chamber; a screen for displaying an entire status of the substrate processing apparatus; and is also capable of displaying, on the second display region, the selecting buttons corresponding to the displayed screens. Further, it may be also possible that the display panel and the selecting unit are implemented by a touch panel including the selection unit disposed on the display panel. By this configuration, the manipulation can be more facilitated.

(2) In accordance with the present invention, there is provided a display method of a display panel for controlling a substrate processing apparatus including at least one processing chamber, the method including: arranging and displaying, on a second display region of the display panel, a selecting button for selecting a screen among at least screens necessary for a maintenance of the substrate processing apparatus in an order of a time sequence in which the selecting buttons have been clicked; and displaying the screen selected by the selecting button on a first display region of the display panel.

Here, it may be desirable that the second display region is displayed along one side of the first display region; each selecting button is displayed on the second display region in a fixed length; and, when an entire length of the selecting buttons exceeds a length of the second display region, the excess selecting button is left as a history and displayed again on the second display region when a display thereof becomes possible.

Further, it may be desirable that a command button for closing the screen displayed on the first display region is displayed on a third display region of the display panel; and the screen on the first display region is closed and a selecting button, corresponding to the screen, displayed on the second display region is also closed when the command button for closing the screen displayed on the first display region is selected.

Moreover, it may be desirable that a single screen selected among the screens according to contents of a maintenance is displayed on the first display region as a screen necessary for the maintenance of the processing chamber displayed on the first display region.

(3) In accordance with the present invention, there is provided a storage medium for storing therein a program for executing a display of a display panel for controlling a substrate processing apparatus including at least one processing chamber on a computer, wherein the program arranges and displays, on a second display region of the display panel, a selecting button for selecting a screen among at least screens necessary for a maintenance of the substrate processing apparatus in an order of a time sequence in which the selecting buttons have been clicked; and displays the screen selected by the selecting button on a first display region of the display panel.

It may be desirable that the program displays the second display region along one side of the first display region; displays each selecting button on the second display region in a fixed length; leaves, when an entire length of the selecting buttons exceeds a length of the second display region, the excess selecting button as a history; and displays the left selecting button again on the second display region when a display thereof becomes possible.

Further, it may be desirable that the program displays, on a third display region of the display panel, a command button for closing the screen displayed on the first display region; and closes the screen on the first display region and also closes a selecting button, corresponding to the screen, displayed on the second display region when the command button for closing the screen displayed on the first display region is selected.

Moreover, it may be desirable that the program displays, on the first display region, a single screen selected among the screens according to contents of a maintenance as a screen necessary for the maintenance of the processing chamber displayed on the first display region.

(4) In accordance with the present invention, there is provided a program for executing a display of a display panel for controlling a substrate processing apparatus including at least one processing chamber on a computer, wherein the program arranges and displays, on a second display region of the display panel, a selecting button for selecting a screen among at least screens necessary for a maintenance of the substrate processing apparatus in an order of a time sequence in which the selecting buttons have been clicked; and displays the screen selected by the selecting button on a first display region of the display panel.

It may be desirable that the program displays the second display region along one side of the first display region; displays each selecting button on the second display region in a fixed length; leaves, when an entire length of the selecting buttons exceeds a length of the second display region, the excess selecting button as a history; and displays the left selecting button again on the second display region when a display thereof becomes possible.

Further, it may be desirable that the program displays, on a third display region of the display panel, a command button for closing the screen displayed on the first display region; and closes the screen on the first display region and also closes a selecting button, corresponding to the screen, displayed on the second display region when the command button for closing the screen displayed on the first display region is selected.

Moreover, it may be also desirable that the program displays, on the first display region, a single screen selected among the screens according to contents of a maintenance as a screen necessary for the maintenance of the processing chamber displayed on the first display region.

Effect of the Invention

In accordance with the present invention, there can be provided the substrate processing apparatus capable of displaying the highly convenient maintenance screen on the display panel when performing the maintenance while considering the correlation between the plurality of processing chambers; the display method of the display panel for controlling the substrate processing apparatus; the program for executing the display on the computer; and the storage medium storing the program therein.

BEST MODE FOR CARRYING OUT THE INVENTION

Hereinafter, embodiments of the present invention will be described in detail with reference to the accompanying drawings. Through the whole documents, like reference numerals denote like parts having substantially identical functions and configurations, so that redundant description thereof will be omitted.

(Configuration Example of Substrate Processing Apparatus)

Figure 1:
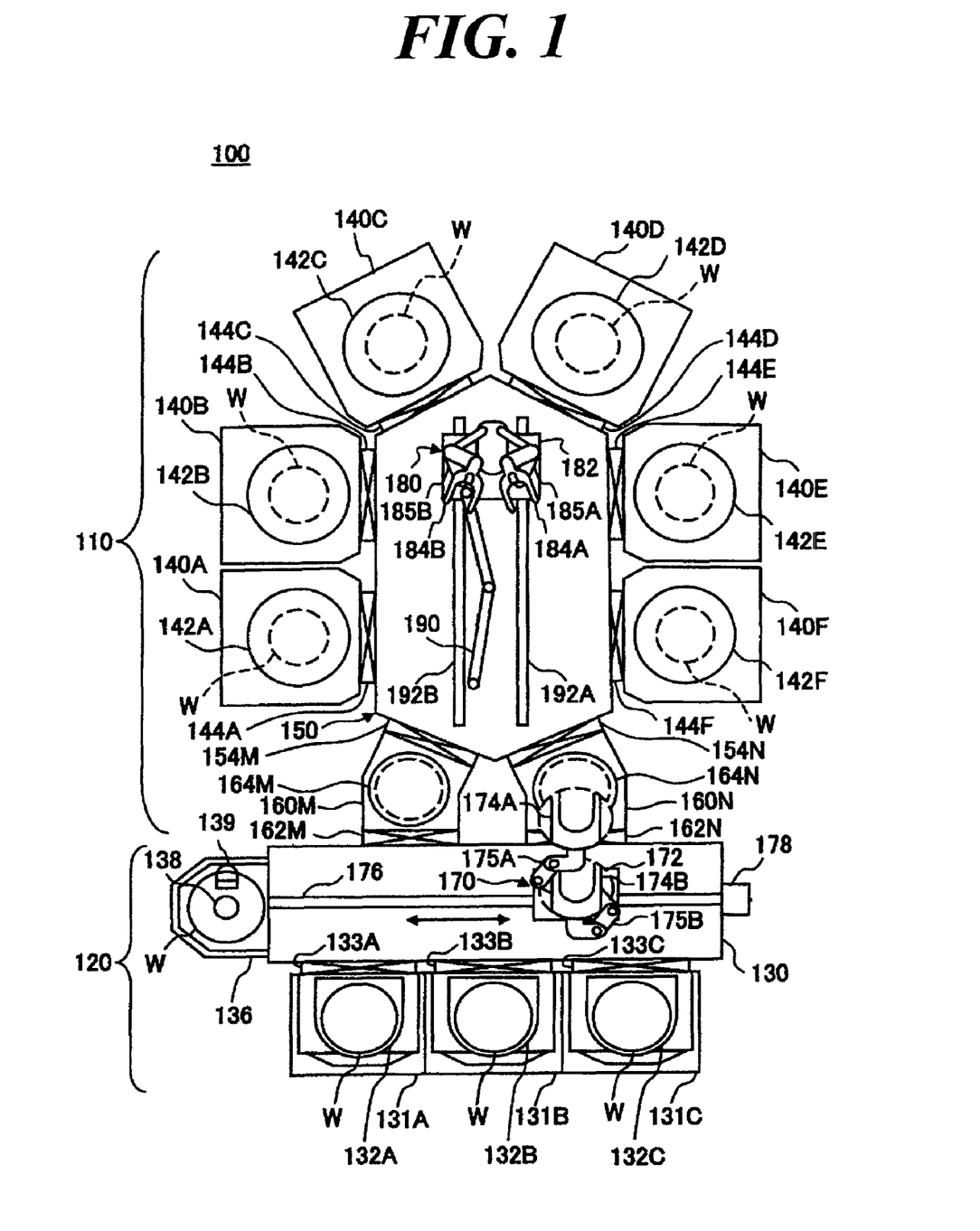
FIG. 1. is a plan view of a substrate processing apparatus in accordance with an embodiment of the present invention.

First, a substrate processing apparatus in accordance with an embodiment of the present invention will be described with reference to the accompanying drawings. FIG. 1 illustrates a schematic configuration of a substrate processing apparatus in accordance with the embodiment of the present invention. The substrate processing apparatus 100 includes a plurality of processing units 110 for performing various kinds of processes such as a film forming process, an etching process and the like on a target substrate, for example, a semiconductor wafer (hereinafter, simply referred to as a "wafer") W; and a transfer unit 120 for loading and unloading the wafer W with respect to the processing units 110.

First, a configuration example of the transfer unit 120 will be explained. As shown in FIG. 1, the transfer unit 120 includes a transfer chamber 130 for loading and unloading the wafer between substrate receptacles, e.g., cassette vessels 132 (132A to 132C) and the processing units 110. The transfer chamber 130 is formed in a box shape having a substantially polygonal cross section (for example, a rectangular cross section). A plurality of cassette stages 131 (131A to 131C) is arranged in juxtaposition at one side constituting a long side of the rectangular cross section of the transfer chamber 130. The cassette stages 131 (131A to 131C) are configured to be capable of accommodating therein the substrate receptacles, for example, the cassette vessels 132A to 132C respectively.

Each of the cassette vessels 132 (132A to 132C) is capable of accommodating therein, for example, a maximum of 25 sheets of wafers while mounting them in multi-levels at a same pitch, and has a hermetic interior structure filled with an $N_2$ atmosphere. The transfer chamber 130 is configured such that the wafer W can be loaded into or unloaded from the inside via gate valves 133 (133A to 133C). Further, the number of the cassette stages 131 and the cassette vessels 132 is not limited to the example illustrated in FIG. 1.

Disposed at an end portion of the transfer chamber 130, i.e., at one side constituting a short side of the rectangular cross section thereof is an orienter (pre-alignment stage) 136 serving as a positioning device having therein a rotary mounting table 138 and an optical sensor 139 for optically detecting a peripheral portion of the wafer W. The orienter 136 performs a position alignment by detecting, for example, an orientation flat or a notch of the wafer W.

Installed inside the transfer chamber 130 is a transfer unit side transfer device (atmospheric transfer device) 170 for loading and unloading the wafer W between the cassette vessels 132A to 132C, load lock chambers 160M and 160N and the orienter 136. The transfer unit side transfer device 170 includes a transfer arm mounted on a support base 172 so as to be revolvable by a revolving operation mechanism, and is configured to be slidable by a sliding operation mechanism along a lengthwise direction of the transfer chamber 130. The transfer arm of the transfer unit side transfer device 170 is configured as, for example, a double-arm mechanism having a pair of multi-joint arms, as illustrated in FIG. 1. The transfer arm shown in FIG. 1 includes a first arm 175A and a second arm 175B vertically arranged in juxtaposition, and each of them is made up of an extensible/retractable multi-joint arm.

The sliding operation mechanism of the transfer unit side transfer device 170 is configured as follows by using, for example, a liner motor. Specifically, a guide rail 176 is installed along the lengthwise direction of the transfer chamber 130, and the base 172 mounted with the transfer arm is installed so as to be slidable along the guide rail 176. Each of the base 172 and the guide rail 176 has a mover and a stator of the linear motor, and a linear motor driving mechanism 178 for driving the linear motor is installed at an end portion of the guide rail 176. The linear motor driving mechanism 178 is connected to a control unit 200. Accordingly, based on a control signal from the control unit 200, the linear motor driving mechanism 178 is operated, so that the transfer unit side transfer device 170 and the base 172 are made to move along the guide rail 176 in a direction marked by an arrow.

Further, like a processing unit side transfer device 180, the sliding operation mechanism of the transfer unit side transfer device 170 can also be implemented by screwing the base 172 with a ball screw installed along the guide rail 176, and by driving the ball screw by a sliding motor, the base 172 can be allowed to make a sliding motion.

The first and the second transfer arm 175A and 175B serving as the transfer arm of the transfer unit side transfer device 170 have picks 174A and 174B at their leading ends, respectively, so that two wafers can be handled at the same time. Accordingly, when loading and unloading the wafers with respect to, for example, the cassette vessel 132, the orienter 136 and each of the load lock chambers 160M and 160N, it is possible to load and unload the wafers while exchanging them. Furthermore, the number of the arms of the transfer arm of the transfer unit side transfer device 170 is not limited to the aforementioned example, and it can be configured as, for example, a single-arm mechanism having only one arm.

Moreover, the transfer unit side transfer device 170 includes a non-illustrated revolving operation motor for revolving the transfer arm and a non-illustrated extending/ retracting operation motor for extending/retracting the transfer arm. As a motor for driving the transfer unit side transfer device 170, an elevating operation motor can also be installed besides the aforementioned examples. Though not shown, each motor is connected to the control unit 200, so that each operation of the transfer arm of the transfer unit side transfer device 170 is controlled based on a control signal from the control unit 200.

Now, a configuration example of the processing unit 110 will be explained. The processing unit 110 is configured as, for example a cluster tool. As illustrated in FIG. 1, the processing unit 110 has a configuration in which the plurality of processing chambers 140 (140A to 140F) for performing a preset process such as a film forming process (e.g., plasma CVD process) or an etching process (e.g., plasma etching process) on the wafer W and the load lock chambers 160M and 160N are commonly connected to a common transfer chamber 150 having a polygonal shape (e.g., a quadrangular shape, a pentagonal shape, a hexagonal shape, an octagonal shape, or the like) elongated in one direction.

Specifically, the common transfer chamber 150 is formed in the polygonal shape (e.g., a flat hexagonal shape) having a pair of facing sides longer than the other sides. The processing chambers 140C and 140D are respectively connected to two leading-end short sides of the flat hexagonal-shaped common transfer chamber 150, and the load lock chambers 160M and 160N are respectively connected to two basal-end short sides of the flat hexagonal-shaped common transfer chamber 150. Further, the two processing chambers 140A and 140B are arranged at and connected to one long side of the common transfer chamber 150, while the rest two processing chambers 140E and 140F are arranged at and connected to the other long side.

The processing chambers 140A to 140F perform, for example, the same or different kinds of processes on the wafer W. Each mounting table 142 (142A to 142F) for mounting the wafer W thereon is installed in each processing chamber 140 (140A to 140F). Further, the number of the processing chambers 140 is not limited to the example shown in FIG. 1.

The common transfer chamber 150 has a function of transferring the wafer W between the above-described processing chambers 140A to 140F, or between each of the processing chambers 140A to 140F and each of the first and second load lock chambers 160M and 160N. Around the common transfer chamber 150, the processing chambers 140 (140A to 140F) are connected via gate valves 144 (144A to 144F), and leading ends of the first and second load lock chambers 160M and 160N are connected via gate valves (vacuum side gate valves) 154M and 154N. The basal ends of the first and second load lock chambers 160M and 160N are connected to the other side constituting another long side of the transfer chamber 130 via gate valves (atmospheric gate valves 162M and 162N).

Each of the first and second load lock chambers 160M and 160N have a function of passing the wafer W to a next processing step after adjusting a pressure while supporting the wafer W therein. Transfer tables 164M and 164N for mounting thereon the wafer W are installed inside the first and second load lock chambers 160M and 160N, respectively.

The first and second load lock chambers 160M and 160N is configured such that a purge of particles such as residues and a vacuum evacuation can be performed. To elaborate, each of the first and second load lock chambers 160M and 160N is provided with, for example, a gas exhaust system including a vacuum pump such as a dry pump connected with a gas exhaust pipe having a gas exhaust valve (a gas exhaust control valve) and a gas introduction system including a gas source connected with a gas inlet pipe having a purge valve (a purge gas control value). By controlling the purge valve, the gas exhaust valve, and the like, a gas exhaust process or a cleaning process of repeating a vacuum exhaust and opening to atmosphere by an introduction of a purge gas is performed.

Further, the common transfer chamber 150 and each of the processing chambers 140A to 140F are also configured such that a purge of such particles as residues and a vacuum evacuation can be performed. For example, a gas introduction system for introducing the aforementioned purge gas and a gas exhaust system capable of carrying out the vacuum evacuation are installed in the common transfer chamber 150, and installed in each of the processing chambers 140A to 140F are a gas introduction system capable of introducing a processing gas as well as the aforementioned purge gas and a gas exhaust system capable of carrying out the vacuum evacuation.

In the processing unit 110, the common transfer chamber 150 and each of the processing chambers 140A to 140F can be opened or closed airtightly with respect to each other, and so are the common transfer chamber 150 and each of the load lock chambers 160M and 160N, as described above. Further, the chambers are configured as the cluster tool, and can be made to communicate with the common transfer chamber 150 when necessary. Further, each of the first and second load lock chambers 160M and 160N and the transfer chamber 130 can also be opened or closed airtightly with respect to each other.

Installed inside the common transfer chamber 150 is the processing unit side transfer device (vacuum transfer device) 180 for transferring the wafer W between the load lock chambers 160M and 160N and each of the processing chambers 140A and 140F. The processing unit side transfer device 180 includes a transfer arm mounted on a base 182 so as to be revolvable by a revolving operation mechanism, and is configured to be slidable by a sliding operation mechanism along the lengthwise direction of the common transfer chamber 150. The transfer arm of the processing unit side transfer device 180 is configured as, for example, a double-arm mechanism, as illustrated in FIG. 1. To elaborate, the transfer arm includes a first arm 185A and a second arm 185B arranged in juxtaposition in a left-right direction, wherein, each of them is made up of an extensible/retractable multi-joint arm.

Figure 2:
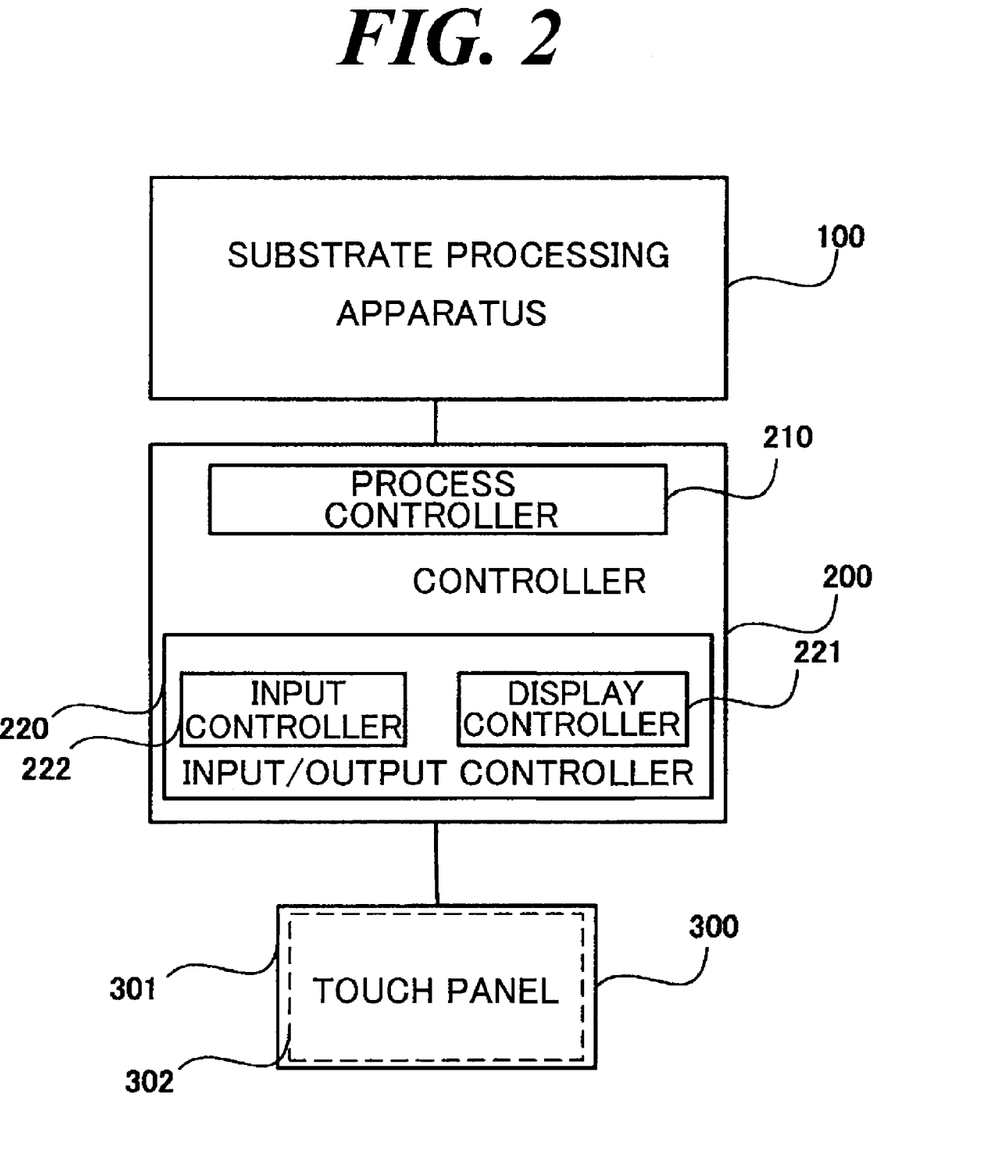
FIG. 2 sets forth a block diagram showing a configuration of a control unit of the substrate processing apparatus shown in FIG. 1.

The operation of the substrate processing apparatus 100 having the above-described configuration is controlled by the control unit. FIG. 2 sets forth a block diagram showing a configuration of the control unit 200.

Though the control unit includes a CPU, at necessary memory, an interface unit, a display unit, an input unit, and so forth because it is typically made up of a computer, FIG. 2 shows a division of the control unit 200 by functions on the assumption that a computer executes a preset program, in order to facilitate the understanding of the configuration of the control unit 200.

Here, as shown in FIG. 2, the control unit 200 includes a process controller 210 for controlling an operation of each component of FIG. 1 (each component constituting the processing unit 110 and each component constituting the transfer unit 120); and an input/output controller 220 for performing an exchange of data with a touch panel 300. Like the control unit 200, the touch panel 300 is also included in the configuration of the substrate processing apparatus 100. The touch panel 300 includes a display panel 301 and a selecting unit 302 disposed on the surface of the display panel 301. The selecting unit 302 is provided for clicking selecting buttons (which will be described later) displayed on the display panel 301. Furthermore, like a typical computer, a display panel such as a liquid crystal display panel, a keyboard, a track ball or the like can be used instead of the touch panel 300. However, if the touch panel 300 is used, an input operation can be performed without any inconvenience even under an inferior environment having a low workability, for example, in a clean room, and a special manipulation table or the like becomes unnecessary.

The input/output controller 220 includes a display controller 221 for performing a control for displaying a screen on the touch panel 300; and an input controller 222 for sending data inputted from the touch panel 300 to the control unit 200.

Figure 3:
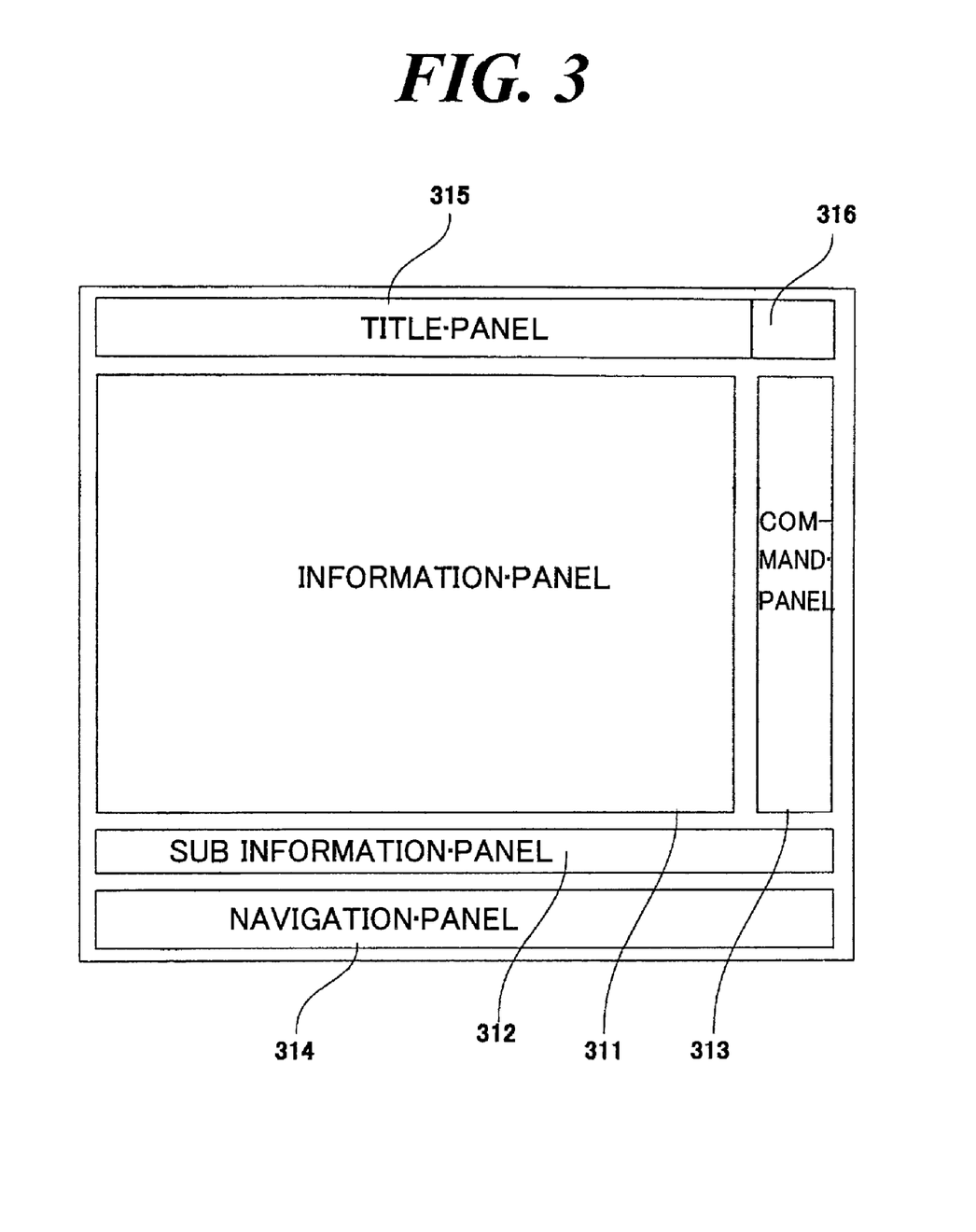
FIG. 3 provides a diagram showing respective display regions on a touch panel screen of the substrate processing apparatus shown in FIG. 1.

As shown in FIG. 3, the display controller 221 displays, on the touch panel 300, a screen having display regions as follows.

(1) A first display region 311 (information•panel) for displaying a main screen of a horizontally elongated rectangular shape in an approximately center position
(2) A second display region 312 (sub information•panel) provided in a band shape along the lower side of the first display region
(3) A third display region 313 (command•panel) provided in a band shape along the right side of the first display region
(4) A fourth display region 314 (navigation•panel) provided in a band shape along the lower portion of the second display region 312
(5) A fifth display region 315 (title•panel) provided in a band shape along the upper side of the first display region
(6) A sixth display region 316 (title•panel) provided in a horizontally elongated rectangular shape in a right upper corner portion of the screen 1. Regarding the First Display Region 311

On the first display region 311, by displaying one or plural information-graphics on every functional region, at least following screens are displayed selectively.

Figure 4:
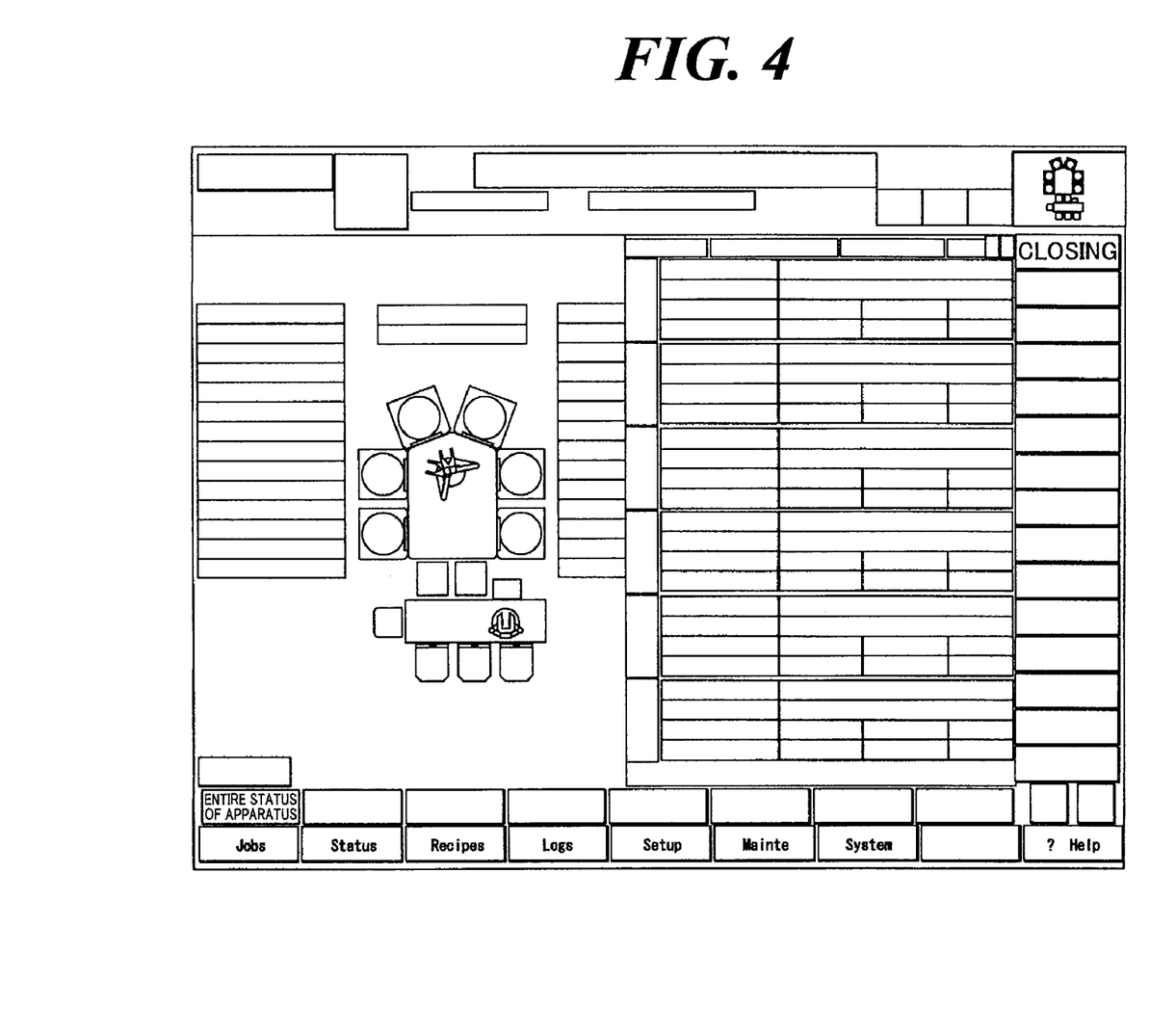
FIG. 4 illustrates a screen showing the entire status of the substrate processing apparatus.

(1) Screen showing the entire status of the substrate processing apparatus (see FIG. 4)

A schematic plan view of the entire apparatus, a module pressure, and detailed information of each processing apparatus and the like can be displayed.

If a processing chamber is clicked on the plan view, a current screen is converted to a screen necessary for the maintenance of the clicked processing chamber.

Figure 5:
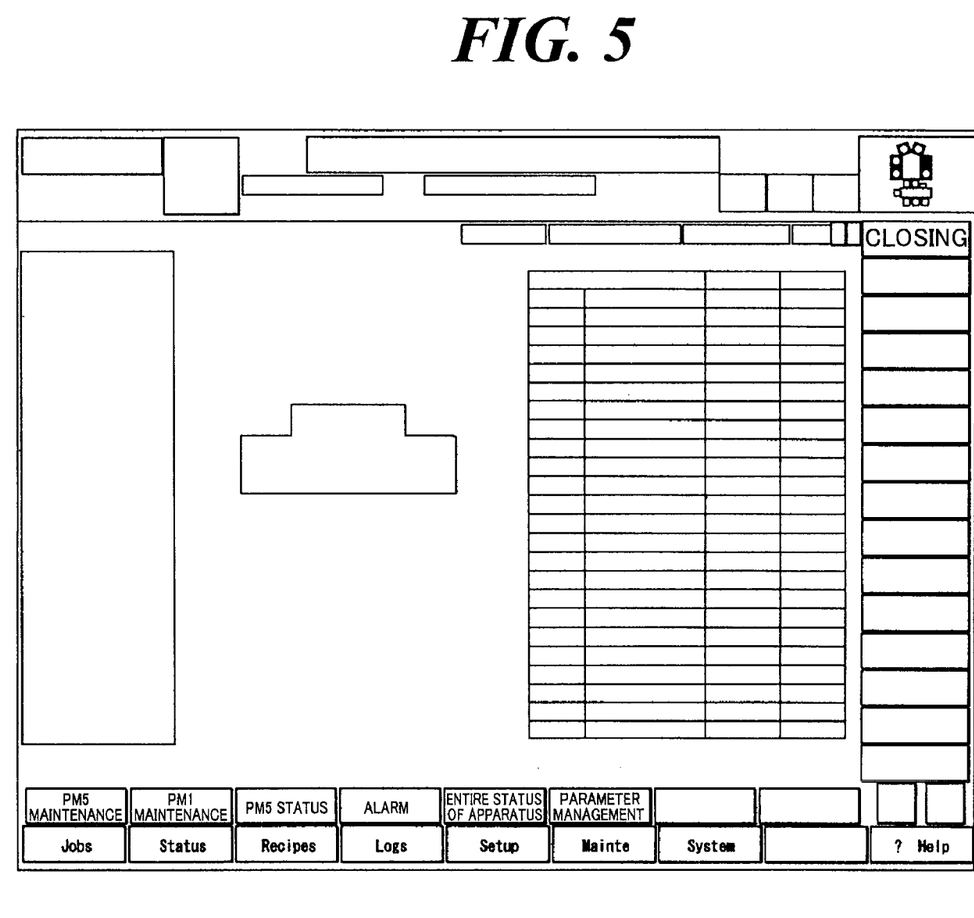
FIG. 5 illustrates a first screen necessary for maintenance of each processing chamber.
Figure 6:
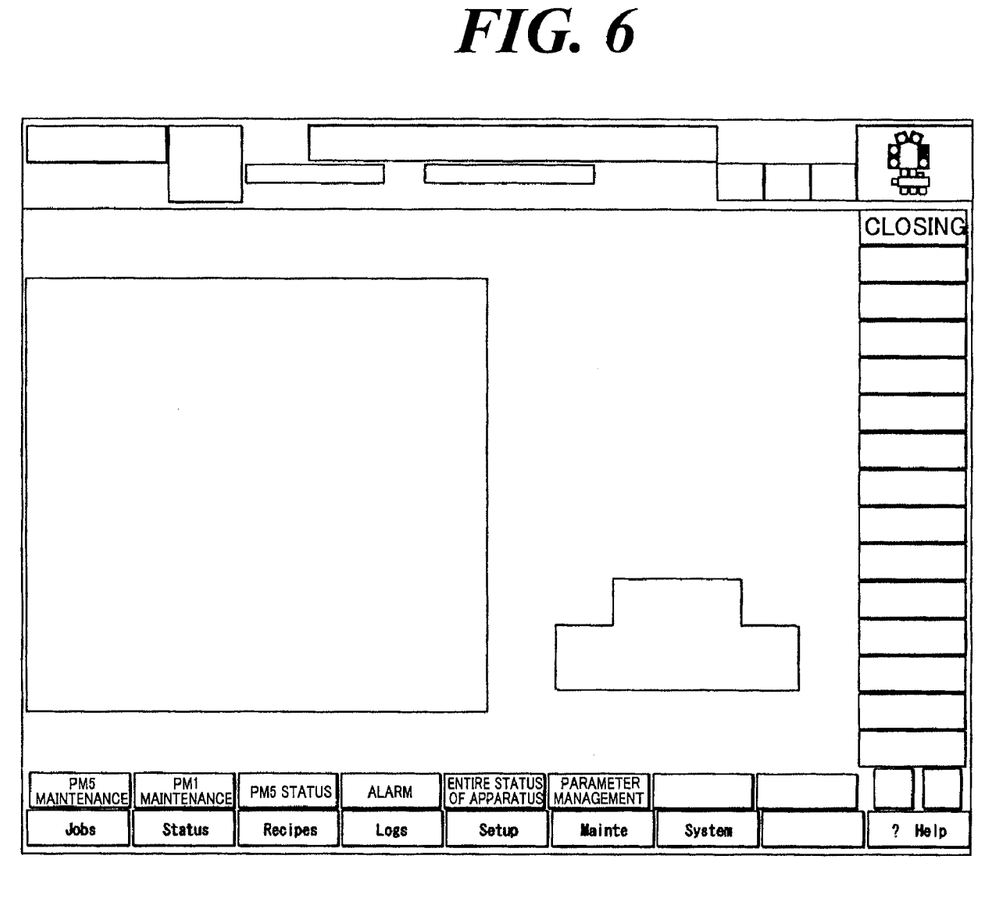
FIG. 6 illustrates a second screen necessary for the maintenance of each processing chamber.
Figure 7:
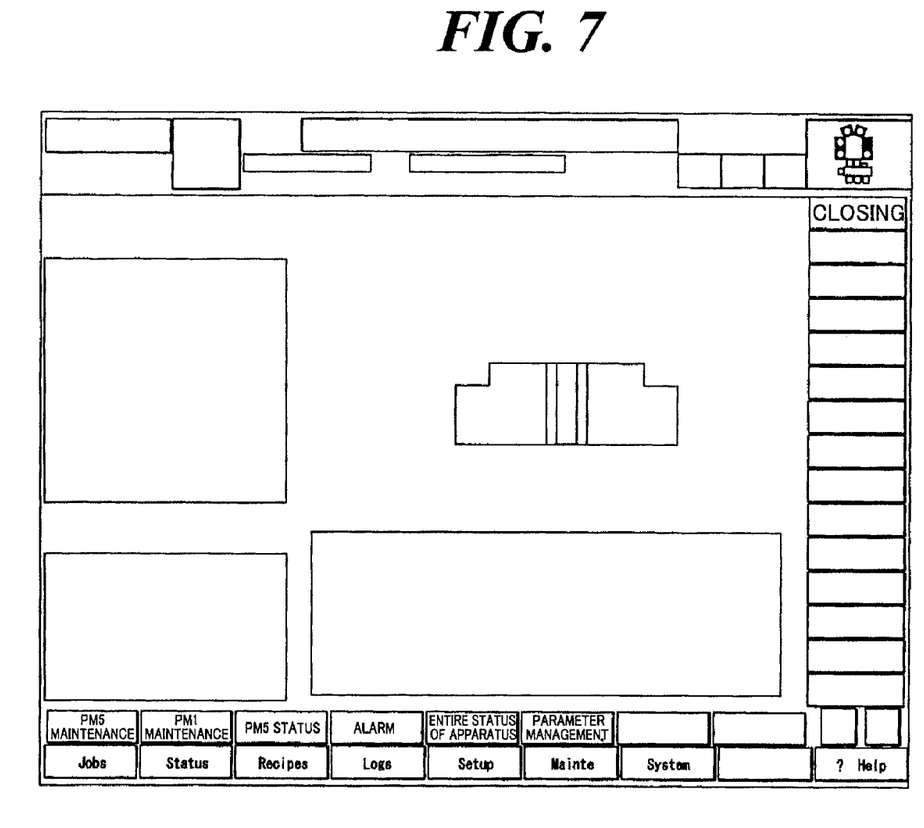
FIG. 7 illustrates a third screen necessary for the maintenance of each processing chamber.

(2) Screens necessary for the maintenance of each processing chamber (see FIGS. 5 to 7)

A front view of each processing chamber and detailed information thereof can be displayed.

If each tab [Module], [Gas], [Pressure], [Temperature], and [Driving system] on the screen is clicked, a screen showing each detailed information is displayed together with the front view of the processing chamber.

FIG. 5 illustrates a screen when the module tab is clicked.
FIG. 6 illustrates a screen when the gas tab is clicked.
FIG. 7 illustrates a screen when the driving system tab is clicked.

(3) Screen showing a status of each processing chamber
(4) Alarm screen
(5) Parameter management screen
(6) Log-in screen
(7) Unit synchronization screen 2. Regarding the Second Display Region 312

Figure 8:
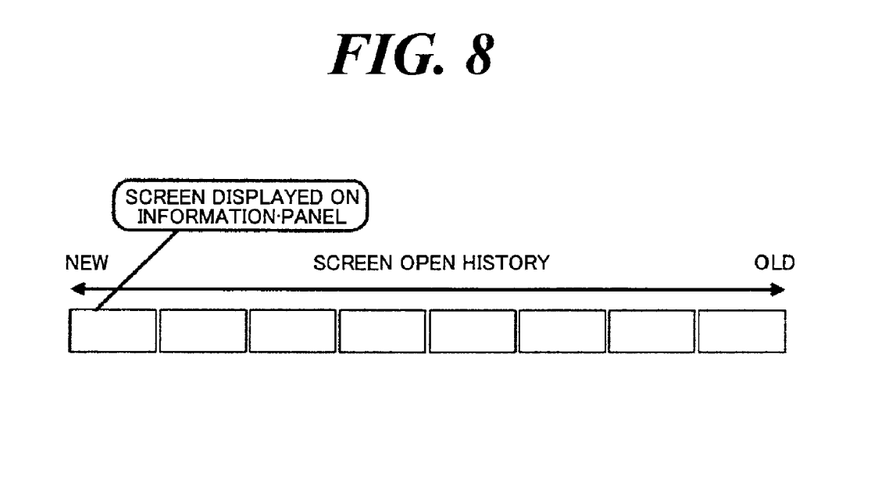
FIG. 8 is a diagram schematically showing an arrangement of task•buttons on a second display region.
Figure 9:
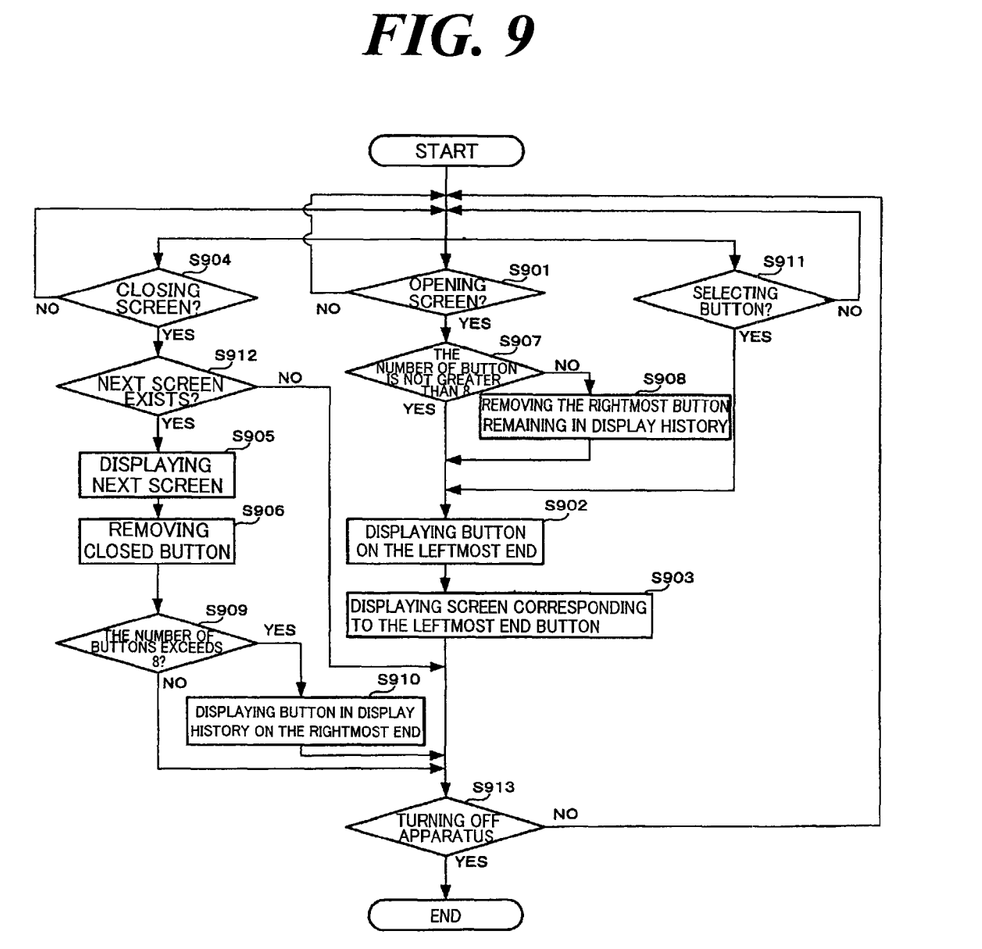
FIG. 9 presents a flowchart to describe an operation for arranging the task•buttons on the second display region.

On the second display region 312, eight selecting buttons (hereinafter, referred to as "task•buttons") are arranged. The buttons are always kept in a valid state, and if a button having a certain screen name is pressed, the selected screen is displayed on the first display region 311. Though a button having no screen name is not in a gray out state, pressing it is impossible. Screens opened by the fourth display region 314, a bookmark, and other various means are all displayed on the task•buttons. As shown in FIG. 8, on the second display region 312, the task•buttons are arranged and displayed from the left side in the order of a time sequence in which the task•buttons have been clicked. That is, the leftmost task•button indicates the latest screen, which is displayed on the first display region 311. Then, the second latest task•button is displayed next to it on the second display region 312, and the other task•buttons are also displayed on the second display region 312 according to the time sequence. FIG. 9 shows a flowchart to describe such operation.

Hereinafter, an operation of a task will be explained according to a user's manipulation.

Figure 10:
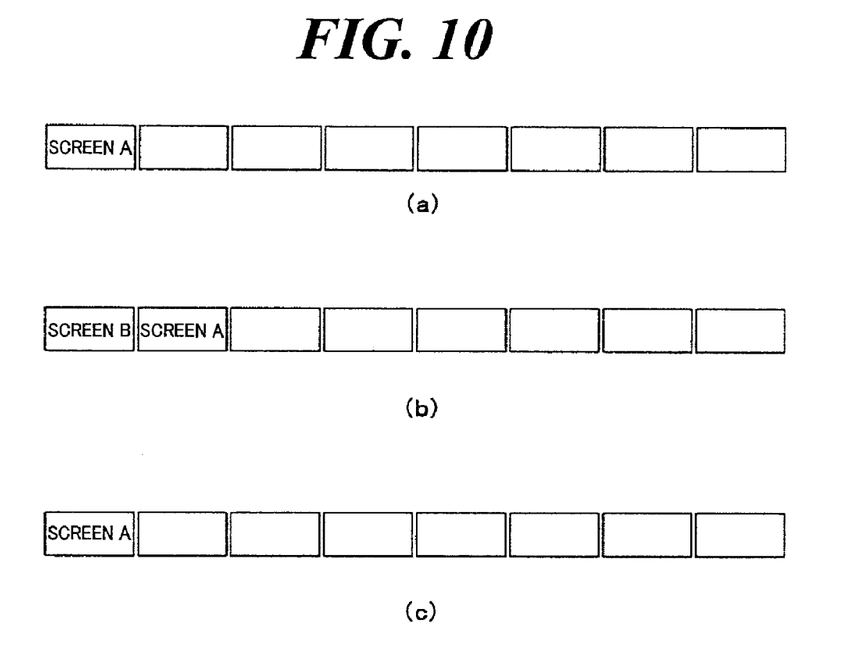
FIGS. 10(a) to 10(c) are first diagrams for describing an operation of arranging the task•buttons on the second display region.

(1) Opening a Screen A (FIG. 10(a))

Through the fourth display region 314, [screen A] is opened. A text of [screen A] is displayed on the left side of the task. (Steps 901, 902 and 903)

(2) Opening a Screen B (FIG. 10(b))

After "opening the Screen A", [screen B] is opened by the fourth display region 314. A text of [screen B] is displayed on the left side of the task. The already opened [screen A] is moved to the right side thereof. (Steps 901, 902 and 903)

(3) Closing the Screen B (see FIG. 10(c))

After "opening the screen B", the [screen B] is closed through the third display region 313. The [screen B] is deleted from the left side of the task, and the already opened [Screen A] is moved to the leftmost side. (Steps 904, 905 and 906)

Figure 11:
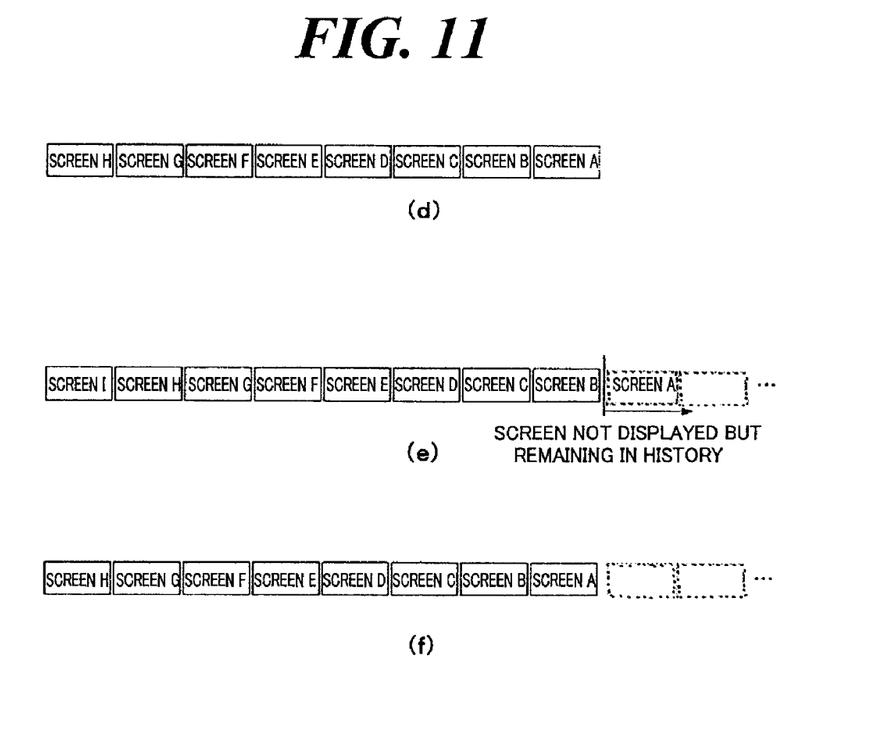
FIGS. 11(d) to 11(f) set forth second diagrams for describing the operation of arranging the task•buttons on the second display region.

(4) Opening Eight Screens (see FIG. 11(d))

Eight screens are opened from a state in which no screen is opened (actually, always starting from a home screen at first), and this is a state in which the task-buttons are fully filled.

(5) Opening More than Eight Screens (See FIG. 11(e))

A screen is more opened in the state where "the eight screens have been opened". In such case, since the [screen A] opened first cannot be displayed on a task•button, it is deleted from the buttons. However, it still remains in a screen display history. (Steps 907 and 908)

(6) Returning the number of opened screens to eight (FIG. 11(f))

In the state where "more than eight screens are opened", [screen I] is closed. In this case, the ninth screen (here, the [screen A]) in the screen history that has not been displayed on the task•buttons is displayed on the rightmost task•button. (Steps 909 and 910)

Figure 12:
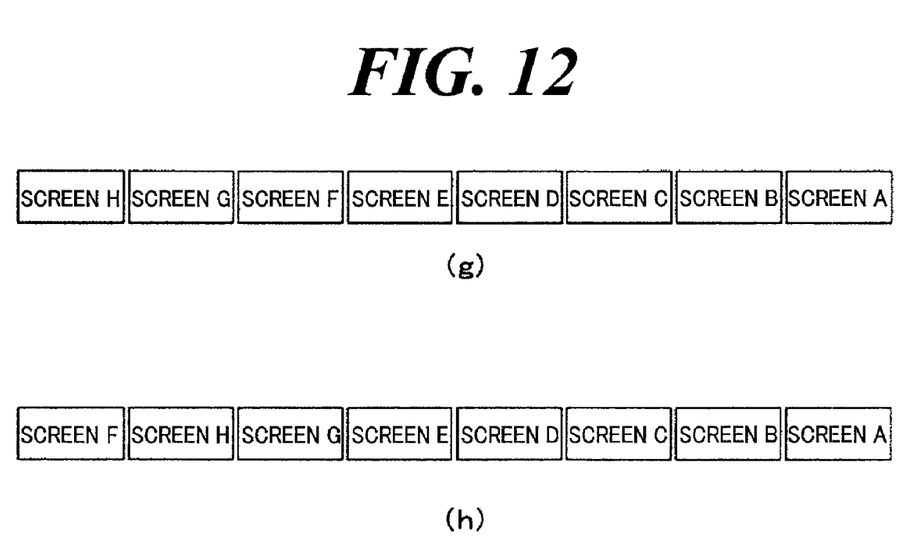
FIGS. 12(g) to 12(h) depict third diagrams for describing the operation of arranging the task•buttons on the second display region.

(7) Selecting a task•button (FIGS. 12(g) and 12(h))

Eight screens are opened from the state where no screen is opened (actually, always starting from the home screen at first). This is a state in which the task•buttons are fully filled (FIG. 12(g)). (The same state as the case of [opening eight screens]

In this state, if [screen F] is selected among the task•buttons, the [screen F] is displayed as described below, such that it is moved to the leftmost task•button (see FIG. 12(h)). (Steps 911, 902 and 903)

(8) Miscellaneous

When the screen is closed in Step 904 and there remains no screen (Step 912), the process returns to Step 901 as long as the apparatus is not turned off (Step 913).

3. Regarding the Third Display Region 313

The third display region 313 is a region on which command•buttons used for the currently displayed first display region 311 are arranged. As commands, there are, for example, [Closing], [Module change], [Initialization], [Opening to atmosphere], and so forth.

That is, commands of an OS (Operating System) used by the process controller 210 are executed by the screen. Typically, the execution of the OS commands needs to be carried out by using a keyboard by way of starting an OS console screen. However, by using the present screen, it becomes possible to execute the OS commands without having to start the OS console screen.

The OS commands regarded as being frequently used are registered in a text file, and the registered commands are executed by being selected from the screen. Moreover, it is also possible to execute the commands by directly inputting them through a software keyboard provided by the system. Further, executed results are stored as logs in a text file. If the screen is changed by a manipulation of the user, a command•button group corresponding to a screen on the first display region 311 is displayed.

When the function of performing [closing] of the screen on the first display region 311 is necessary, a [closing] button has to be arranged at the position of the uppermost command•button.

4. The Fourth Display Region 314

This is a panel for selecting the screen displayed on the first display region 311 from the functional regions of the system. If any one of the following selecting buttons (navigation-buttons) within the fourth display region 314 is pressed, a screen of the selected functional region is displayed on the first display region 311. Exceptionally, however, when a [Help] button arranged on the right side is pressed, [Screen manipulation help-dialogue•box] is displayed on the first display region 311.

(1) Jobs

This button is for displaying a process startup related manipulation, a progress of a material processing and a state of the material being processed.

(2) Status

This button is for performing monitoring manipulation in a typical apparatus operation status. This button is also for displaying the status of the entire apparatus, a device constituting the apparatus, or the like.

(3) Recipes

This button is for performing a recipe related manipulation, a recipe generation, a recipe editing, and a recipe management (storage, copy, and so forth).

(4) Logs

This button is for performing a display or a management of logs.

(5) Setup

This button is for performing a preparation•setup•management of an apparatus operation, a management of items related to the apparatus operation and a user account, a hardware configuration, a setup of parameters, a setup of a host communication control, and so forth.

(6) Maintenance

This button is for performing an apparatus repair related manipulation, a maintenance manipulation, a manual movement manipulation, a macro manipulation, and an engineering level manipulation.

(7) System

This button is for performing a manipulation hardly used in the apparatus operation and having no effect thereon. This button is for performing a display of system operation related items, an M/C status, an apparatus startup, and version information.

(8) Preliminary

This button is a command•button having no description on it, and is provided for a preliminary purpose.

(9) Help

This button is for displaying an interface related help, an operation related help and an apparatus manual.

5. The Fifth Display Region 315

The fifth display region 315 is located at the topmost portion of the screen, and has a function capable of being used by all screens. The fifth display region 315 has to allow a manipulation of the user even if there is displayed, for example, a dialogue•box for informing the user of information. For example, it displays the following screens.

(1) Data/time display region

[Date/time] is displayed.

(2) Screen Name Display Region

The name of the currently displayed screen is displayed.

(3) Host Communication Status Display Region

The current host communication status is displayed.

(4) Login/Logout-Button

A login/logout-button is displayed.

(5) Logo Display Region

A logo of a maker of the present apparatus is displayed, and a maker name is informed to the user.

(6) Alarm•Message•Button

A latest warning/alarm is displayed. Here, in case that a plurality of warnings/alarms is generated, a display of one having a higher importance has a priority over a display of the latest one. That is, in case that an alarm having a low importance is newly generated while an alarm having a higher importance has been being generated, the alarm having the higher importance is kept being displayed without displaying the alarm of the lower importance. When alarms having the same importance are generated, the latest one is displayed.

(7) Home Screen Transition Button

By pressing this button, a home screen registered for every user is displayed.

6. The Sixth Display Region 316

The status of the entire apparatus displayed. For example, the entire apparatus is displayed as, for example, a plan view as illustrated in FIG. 1. When a maintenance screen for a certain processing chamber is selected on the first display region 311, the selected processing chamber is displayed by emphasizing it. Accordingly, the user can specify the processing chamber under the maintenance among the entire apparatus.

As described above, in accordance with the present embodiment, since the task•buttons are arranged and displayed from the left in the order of time sequence in which the task•buttons are clicked, the highly convenient maintenance screen can be displayed on the touch panel 300 when performing the maintenance.

Here, it should be noted that the present invention is not limited to the above-described embodiment.

For example, though the aforementioned substrate processing apparatus has been described to have the plurality of processing chambers, the present invention is also applicable to a substrate processing apparatus having a single processing chamber or a substrate processing apparatus installed with only one processing chamber though it can be installed with a plurality of processing chambers.

EXPLANATION OF CODES

| | |
|---|---|
| 100: | Substrate processing apparatus |
| 200: | Control unit |
| 210: | Process controller |
| 220: | Input/output controller |
| 221: | Display controller |
| 222: | Input controller |
| 300: | Touch panel |
| 311: | First display region |
| 312: | Second display region |
| 313: | Third display region |

222: Input controller
300: Touch panel
311: First display region
312: Second display region
313: Third display region

What is claimed is:

1. A substrate processing apparatus including at least one processing chamber, the apparatus comprising:
    a display panel;
    a display control unit for performing a control for displaying at least screens necessary for a maintenance of the substrate processing apparatus and preset selecting buttons on the display panel; and
    a selecting unit for clicking the selecting buttons displayed on the display panel,
    wherein the display control unit arranges and displays, on a second display region of the display panel, one of the selecting buttons for selecting a screen among at least screens necessary for the maintenance of the substrate processing apparatus in an order of a time sequence in which the selecting buttons have been clicked so that the leftmost selecting button indicates the latest screen; and displays the screen selected by the one of the selecting buttons on a first display region of the display panel, and
    the display control unit displays the second display region along one side of the first display region; displays each selecting button on the second display region in a fixed length; leaves out, when an entire length of the selecting buttons exceeds a length of the second display region, an excess portion of the selecting buttons from the second display region and saves the excess portion as history; and displays the excess portion again on the second display region when a display thereof becomes possible.

2. The substrate processing apparatus of claim 1, wherein the display control unit displays, on a third display region of the display panel, a command button for closing the screen displayed on the first display region; and closes the screen on the first display region and also closes one of the selecting buttons, corresponding to the screen, displayed on the second display region when the command button for closing the screen displayed on the first display region is clicked by the selection unit.

3. The substrate processing apparatus of claim 1, wherein the display control unit displays, on the first display region, a single screen selected by the selecting unit among the screens according to contents of a maintenance as a screen necessary for the maintenance of the processing chamber displayed on the first display region.

4. The substrate processing apparatus of claim 1, wherein the display control unit is capable of displaying, on the first display region, each processing chamber screen for displaying a status of each processing chamber; a screen for displaying an entire status of the substrate processing apparatus; and is also capable of displaying, on the second display region, the selecting buttons corresponding to the displayed screens.

5. The substrate processing apparatus of claim 1, wherein the display panel and the selecting unit are implemented by a touch panel including the selection unit disposed on the display panel.

6. A display method of a display panel for controlling a substrate processing apparatus including at least one processing chamber, the method comprising:
    arranging and displaying, on a second display region of the display panel, one of selecting buttons for selecting a screen among at least screens necessary for a maintenance of the substrate processing apparatus in an order of a time sequence in which the selecting buttons have been clicked so that the leftmost selecting button indicates the latest screen;
    displaying the screen selected by the one of the selecting buttons on a first display region of the display panel;
    displaying the second display region along one side of the first display region;
    displaying each selecting button on the second display region in a fixed length;
    leaving out, when an entire length of the selecting buttons exceeds a length of the second display region, an excess portion of the selecting buttons from the second display region and saving the excess portion as history; and displaying the excess portion again on the second display region when a display thereof becomes possible.

7. The display method of claim 6, further comprising:
    displaying, on a third display region of the display panel, a command button for closing the screen displayed on the first display region; and
    closing the screen on the first display region and also closing one of the selecting buttons, corresponding to the screen, displayed on the second display region when the command button for closing the screen displayed on the first display region is selected.

8. The display method of claim 6, further comprising:
    displaying, on the first display region, a single screen selected among the screens according to contents of a maintenance as a screen necessary for the maintenance of the processing chamber displayed on the first display region.

9. A non-transitory storage medium for storing therein a program for executing a display of a display panel for controlling a substrate processing apparatus including at least one processing chamber on a computer, wherein the program arranges and displays, on a second display region of the display panel, one of selecting buttons for selecting a screen among at least screens necessary for a maintenance of the substrate processing apparatus in an order of a time sequence in which the selecting buttons have been clicked so that the leftmost selecting button indicates the latest screen; and displays the screen selected by the one of the selecting buttons on a first display region of the display panel, and the program displays the second display region along one side of the first display region; displays each selecting button on the second display region in a fixed length; leaves out, when an entire length of the selecting buttons exceeds a length of the second display region, an excess portion of the selecting buttons from the second display region and saves the excess portion as history; and displays the excess portion again on the second display region when a display thereof becomes possible.

10. The non-transitory storage medium of claim 9, wherein the program displays, on a third display region of the display panel, a command button for closing the screen displayed on the first display region; and closes the screen on the first display region and also closes one of the selecting buttons, corresponding to the screen, displayed on the second display region when the command button for closing the screen displayed on the first display region is selected.

11. The non-transitory storage medium of claim 9, wherein the program displays, on the first display region, a single screen selected among the screens according to contents of a maintenance as a screen necessary for the maintenance of the processing chamber displayed on the first display region.

* * * * *

UNITED STATES PATENT AND TRADEMARK OFFICE
CERTIFICATE OF CORRECTION

| | |
|---|---|
| PATENT NO. | : 8,314,776 B2 |
| APPLICATION NO. | : 12/305494 |
| DATED | : November 20, 2012 |
| INVENTOR(S) | : Hiroyuki Hosokawa et al. |

It is certified that error appears in the above-identified patent and that said Letters Patent is hereby corrected as shown below:

In the Specification; column 2 line 26, please remove the word "first".

Signed and Sealed this
Fourteenth Day of May, 2013

Teresa Stanek Rea
*Acting Director of the United States Patent and Trademark Office*